(12) United States Patent
Whitefield et al.

(10) Patent No.: US 7,315,360 B2
(45) Date of Patent: Jan. 1, 2008

(54) SURFACE COORDINATE SYSTEM

(75) Inventors: Bruce J. Whitefield, Camas, WA (US); Jason W. McNichols, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 283 days.

(21) Appl. No.: 10/949,760

(22) Filed: Sep. 24, 2004

(65) Prior Publication Data

US 2006/0073617 A1  Apr. 6, 2006

(51) Int. Cl.
*G01B 1/00* (2006.01)
(52) U.S. Cl. .................................... 356/150
(58) Field of Classification Search ............... 356/150, 356/138
See application file for complete search history.

(56) References Cited

U.S. PATENT DOCUMENTS

| | | | |
|---|---|---|---|
| 5,438,209 A * | 8/1995 | Yamamoto et al. | 250/559.29 |
| 6,342,705 B1 * | 1/2002 | Li et al. | 250/559.4 |
| 6,432,800 B2 | 8/2002 | Park | |
| 6,906,794 B2 | 6/2005 | Tsuji | |

* cited by examiner

*Primary Examiner*—Roy M. Punnoose
(74) *Attorney, Agent, or Firm*—Luedeka, Neely & Graham

(57) ABSTRACT

A method for creating a reference for a first position on a substrate edge. A first reference point is selected relative to a circumference of the substrate edge, and a second reference point is selected relative to a bevel of the substrate edge. A first distance along the circumference of the substrate edge between the first reference point and the first position is identified as a first coordinate, and a second distance along the bevel of the substrate edge between the second reference point and the first position is identified as a second coordinate. The first coordinate and the second coordinate are used as the reference for the first position.

20 Claims, 2 Drawing Sheets

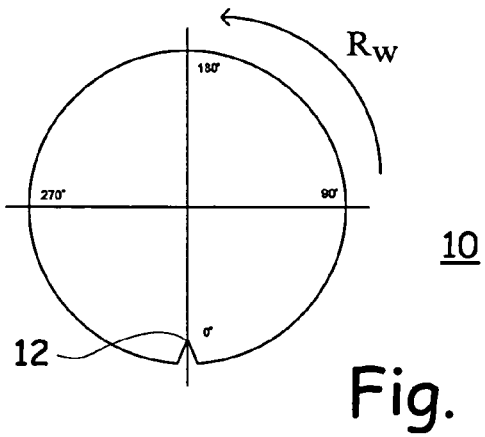
Fig. 1
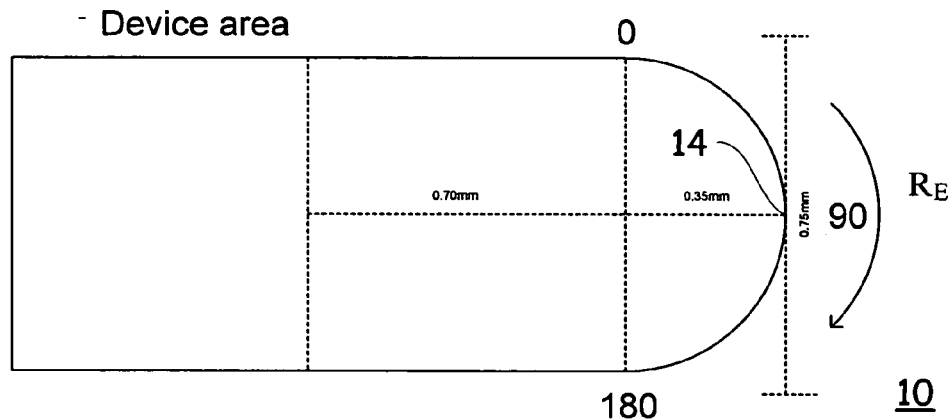
Fig. 2
Reference coordinates
| Data Pt | Site # | $R_W$ | $R_E$ | X size | Y Size | Class Code | SubClass Code | Image # | Image Type | Lot ID | Wafer ID | Comments |
|---|---|---|---|---|---|---|---|---|---|---|---|---|
| 1 | 29 | 97.0314 | 132.1167 | 59 | 132 | Particle | AIO | 235427 | SEM | GAF1234.1 | 23 | |
| 2 | 29 | 97.0314 | 132.1167 | 59 | 132 | Particle | AIO | 235428 | Optical | GAF1234.1 | 23 | |
| 3 | 29 | 97.0314 | 132.1167 | 59 | 132 | Particle | AIO | 235429 | EDS | GAF1234.1 | 23 | |
| 4 | 30 | 350.2961 | 10.4921 | 130 | 1995 | Scratch | Radial | 235430 | Optical | GAF1234.1 | 23 | |
| 5 | 30 | 350.2979 | 10.4933 | 159 | 25421 | Scratch | Radial | 235431 | Optical | GAF1234.1 | 23 | |
| 6 | 30 | 350.2965 | 10.4958 | 130 | 1995 | Scratch | Radial | 235432 | Optical | GAF1234.1 | 23 | Big Scratch |
Data associated to the site and reference coordinates
16
Fig. 3

SURFACE COORDINATE SYSTEM

FIELD

This invention relates to the field of integrated circuit fabrication. More particularly, this invention relates to referencing the location of edge positions on a substrate.

BACKGROUND

As used herein, the term "integrated circuits" generally refers to monolithic semiconducting devices, such as those formed of group IV materials like silicon or germanium or mixtures thereof, or group III-V compounds such as gallium arsenide. The term "integrated circuits" includes all known configurations of such devices, such as memory and logic, and all designs of such devices, such as CMOS and bipolar.

Typically, many integrated circuits are fabricated on a common substrate, which enables easier handling of the integrated circuits, and other benefits. At the end of the fabrication process, the integrated circuits on the substrate are singulated into individual devices for packaging, further processing, and testing. Defects that originate from the edge of the substrate have a significant impact on device yields. Characterizing the nature of the defect sources in this part of the substrate is difficult to do, due to a lack of review tools and methods to reliably and repeatably navigate to a specific location in this portion of the substrate.

The current state of the art is to scan the edge of the substrate for recognizable features, or to mark the substrate somehow with a feature such as a scratch, a laser dot, or a focused ion beam mark. However, there are many problems associated with the current approaches. For example, at high magnifications it can be difficult to locate or recognize a feature to navigate by. Useful features may not be available in the area of interest, such as around near the back of the substrate. Laser marking or focused ion beam marking equipment is expensive, and often is not available on the equipment where edge review is accomplished. Further, marking tends to not be repeatable between users. In addition, marking can result in defects caused by the marking method itself, which inflicted defects can be confused for the defects being analyzed. Although marking the substrate can enable navigation back to a site to some limited degree, it cannot be used to reference positional locations in a data system where other information about the features of interest is stored.

What is needed, therefore, is a system of referencing substrate edge positions that overcomes problems such as those described above, at least in part.

SUMMARY

The above and other needs are met by a method for creating a reference for a first position on a substrate edge. A first reference point is selected relative to a circumference of the substrate edge, and a second reference point is selected relative to a bevel of the substrate edge. A first distance along the circumference of the substrate edge between the first reference point and the first position is identified as a first coordinate, and a second distance along the bevel of the substrate edge between the second reference point and the first position is identified as a second coordinate. The first coordinate and the second coordinate are used as the reference for the first position.

In this manner, the method according to the present invention provides a specific and repeatable system for uniformly and universally assigning position coordinates for locations on the edge of a substrate. With such a method, databases of edge positions, and characteristics associated with those edge positions, can be created. Further, systems such as inspection systems can use the method to record the location of given positions, such as where defects or other anomalies reside. In addition, other systems, such as analysis systems, can reliably investigate a substrate anomaly, based on the previously recorded position of the anomaly.

In various embodiments, the first reference point is one of a notch, a major flat, a minor flat, and a top of the substrate. Preferably, the second reference point is one of a top flat of the bevel, a ninety degree point of the bevel, and a bottom flat of the bevel. The first distance is preferably measured in one of length along the circumference of the substrate and rotation of the substrate. The second distance is preferably measured in one of length along the bevel and angular position along the bevel. The method also preferably includes constructing a data structure that correlates the first coordinate, the second coordinate and information about a characteristic of the substrate at the first position for a plurality of first positions.

According to another aspect of the invention there is described an apparatus for creating a reference for a first position on a substrate edge. A stage receives the substrate and brings the substrate into a known orientation having a first reference point relative to a circumference of the substrate edge, and a second reference point relative to a bevel of the substrate edge. The stage is able to move at least the edge of the substrate under an element, and disposes the first position on the substrate edge under the element. Means are employed to identify as a first coordinate a first distance along the circumference of the substrate edge between the first reference point and the first position, and for identifying as a second coordinate a second distance along the bevel of the substrate edge between the second reference point and the first position. A memory captures the first coordinate and the second coordinate as the reference for the first position.

In various embodiments of this aspect of the invention, an output sends the reference to a storage means. The apparatus can be one of an optical inspection system, a scanning electron microscope, and a focused ion beam. The first reference point is preferably one of a notch, a major flat, a minor flat, and a top of the substrate, and the second reference point is preferably one of a top flat of the bevel, a ninety degree point of the bevel, and a bottom flat of the bevel. In some embodiments the element is a sensor. The first distance can be measured in one of length along the circumference of the substrate and rotation of the substrate, and the second distance can be measured in one of length along the bevel and angular position along the bevel. Some embodiments include an input to receive a data structure that correlates the first coordinate, the second coordinate and information about a characteristic of the substrate at the first position for a plurality of first positions.

According to yet another aspect of the invention there is described an apparatus for positioning a substrate to a reference for a first position on an edge of the substrate. A stage receives the substrate and brings the substrate into a known orientation, where the known orientation has a first reference point relative to a circumference of the substrate edge, and a second reference point relative to a bevel of the substrate edge. An input receives the reference as a first coordinate of a first distance along the circumference of the substrate edge between the first reference point and the first position, and as a second coordinate of a second distance along the bevel of the substrate edge between the second reference point and the first position. The stage moves the first position under an element.

In various embodiments, the apparatus is one of an optical inspection system, a scanning electron microscope, and a focused ion beam. The first reference point is preferably one of a notch, a major flat, a minor flat, and a top of the substrate, and the second reference point is preferably one of a top flat of the bevel, a ninety degree point of the bevel, and a bottom flat of the bevel. In some embodiments the element is a sensor. The first distance can be measured in one of length along the circumference of the substrate and rotation of the substrate, and the second distance can be measured in one of length along the bevel and angular position along the bevel. In some embodiments the apparatus reads a data structure that correlates the first coordinate, the second coordinate and information about a condition of the substrate at the first position for a plurality of first positions.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 1 depicts a top plan view of a substrate and one embodiment of a circumferential reference according to the present invention.

FIG. 2 depicts a cross sectional view of a substrate and one embodiment of a bevel reference according to the present invention.

FIG. 3 depicts a data table according to one embodiment of the present invention.

DETAILED DESCRIPTION

Figure 4:
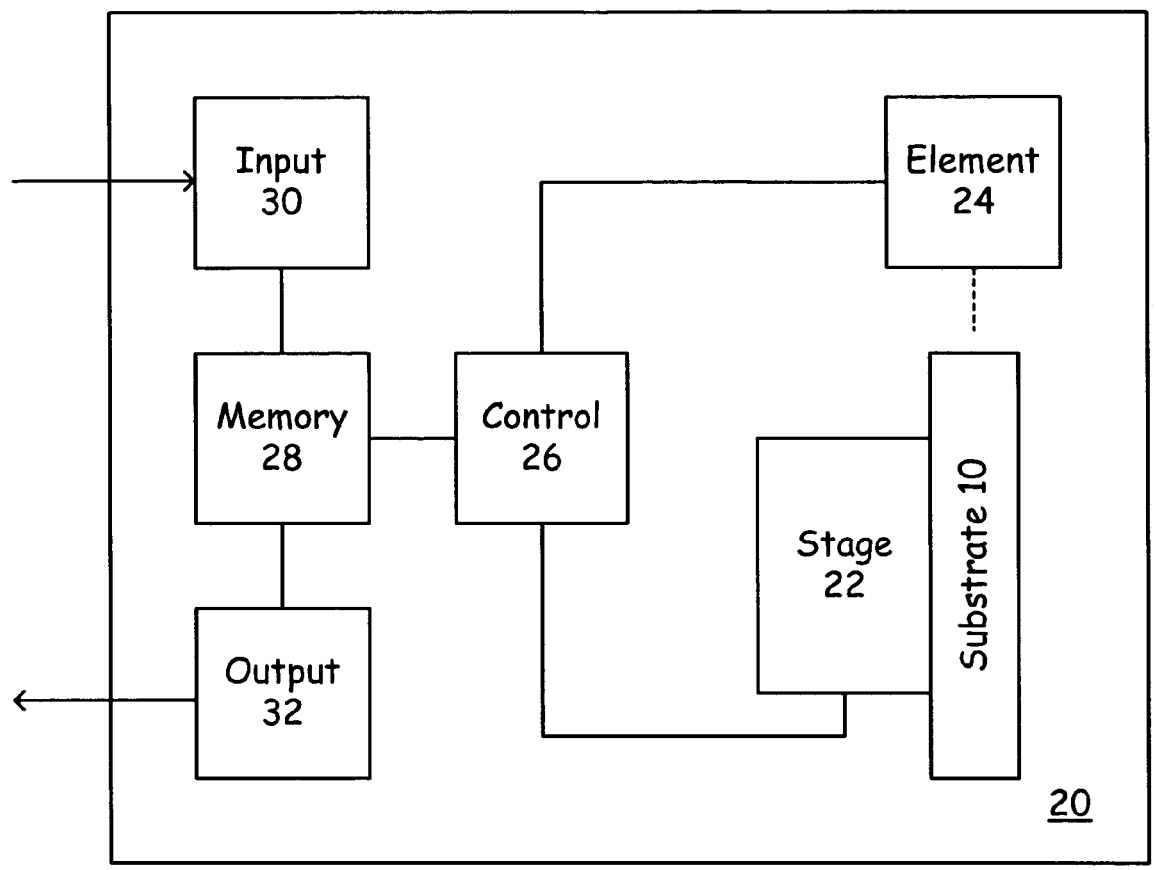
FIG. 4 depicts a functional representation of an apparatus for creating a reference for a position on a substrate and for positioning a substrate based on a reference.

The current invention is directed to a universal navigation coordinate system that can be used by multiple tool types such as scanning electron microscopes, focused ion beams, optical review stations, and automated edge inspection systems to locate, reference, and relocate positions on the substrate edge as needed. Preferably, two polar-like coordinate values are used. The first coordinate value, referred to herein as RW, preferably defines the position around the substrate 10 circumference, relative to a reference site such as the substrate notch 12, as depicted in FIG. 1.

The first coordinate value preferably measures a distance between the reference site 12 and the position of interest on the edge of the substrate 10. This distance can be measured in variety of ways. for example, one method of measuring the distance is to measure a length at the circumference of the substrate 10 between the reference site 12 and the point of interest. Another method of measuring the distance is to measure an angular rotation between the reference site 12 and the point of interest, such as in degrees or radians. Each of these could be accompanied with a positive or negative value as an indication of the direction of travel from the reference point 12. Other methods of measuring the distance are also contemplated under the present invention.

The second coordinate value, referred to herein as RE, preferably defines the location on the edge around the edge bevel of the substrate 10. This coordinate is preferably referenced from some point 14 on the bevel, such as the top flat, the ninety degree point, or the bottom flat, as depicted in FIG. 2. The second coordinate value preferably measures a distance between the reference point 14 on the bevel and the point of interest. This distance can be measured in different ways, such as a length, with a positive or negative indication, between the reference point 14 on the bevel and the point of interest. Alternately, a measurement such as an angular measurement from the reference point 14 on the bevel, such as the 90 degree point on the bevel, could be used The combination of these two coordinates uniquely identifies any location on the edge of the substrate 10. This information is preferably combined with other data about the point or feature of interest on the edge of the substrate 10, to create an edge reference table 16 that relates all of the information back to the unique location. FIG. 3 depicts an example of such a reference table 16. Using the coordinate system and reference information enables relocating specific sites on the substrate edge surface with different review or analysis tools, such as for further characterization for data collection.

This invention enables engineers to locate and relocate specific sites of interest on the edge of the substrate 10 and collect information about that site into a data table 16. Ease of review and analysis enables defect problems to be more quickly understood and corrected. The coordinate system and common file format enables the information to be transported to different analysis tools and used for navigation and additional data recording so that many different methods of analysis can be brought to bear on a problem.

The methods as described above are preferably incorporated into various pieces of equipment, such as inspection and analysis systems. A functional block diagram of a such a system 20 is depicted in FIG. 4. The system 20, in its basic implementations, preferably includes a motion stage for moving a substrate 10 relative to an element 24. In various embodiments, the element 24 is a sensor, such as an optical sensor, or an electron beam of a scanning electron microscope, or a focused ion beam. In other embodiments the element 24 can be some type of analysis device. Both the element 24 and the stage 22, and ail other components of the system 20, are preferably connected to and under the control of a controller 26.

A memory 28 is preferably used to store the positional coordinates as described above. The memory 28 can be used to initially store the coordinates when they are determined by the system 20, or can be used by the system 20 to position the substrate 10 when they have been determined by some other system. An input 30 is preferably used to receive the coordinates from another system, such as a central database, another coordinate determination system, or a keyboard, and an output 32 is preferably used to send the coordinates to another system, such as a central database, another coordinate location system, or a display.

The value of a system according to the present invention is generally growing, due to an increasing awareness of how structures and defects at the edge of the substrate effect the yield of devices on the substrate surface. In three hundred millimeter substrate processing, the effect of the substrate edge is even more pronounced. A number of companies are developing edge inspection and review equipment for edge applications. This situation is very similar to the early development of automated inspection equipment for the patterned surface of the substrate.

It is appreciated that different coordinate nomenclature or units can be used with such "polar" coordinates, and with different reference points, such as the top of the substrate.

Further, the reference table could alternately be organized in different formats, such as having values organized in rows instead of columns, or using a relational database without a table format.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for creating a reference for a first position on a substrate edge, the method comprising the steps of:
    selecting a first reference point relative to a circumference of the substrate edge,
    selecting a second reference point relative to a bevel of the substrate edge,
    identifying as a first coordinate a first distance along the circumference of the substrate edge between the first reference point and the first position,
    identifying as a second coordinate a second distance along the bevel of the substrate edge between the second reference point and the first position,
    using the first coordinate and the second coordinate as the reference for the first position, and
    generating a signal indicative of the reference.

2. The method of claim 1, wherein the first reference point is one of a notch, a major flat, a minor flat, and a top of the substrate.

3. The method of claim 1, wherein the second reference point is one of a top flat of the bevel, a ninety degree point of the bevel, and a bottom flat of the bevel.

4. The method of claim 1, wherein the first distance is measured in one of length along the circumference of the substrate and rotation of the substrate.

5. The method of claim 1, wherein the second distance is measured in one of length along the bevel and angular position along the bevel.

6. The method of claim 1, further comprising constructing a data structure that correlates the first coordinate, the second coordinate and information about a condition of the substrate at the first position for a plurality of first positions.

7. An apparatus for creating a reference for a first position on a substrate edge, the apparatus comprising:
    a stage adapted to receive the substrate and bring the substrate into a known orientation having a first reference point relative to a circumference of the substrate edge, and a second reference point relative to a bevel of the substrate edge,
    the stage further adapted to move at least the edge of the substrate under an element, and to dispose the first position on the substrate edge under the element,
    means for identifying as a first coordinate a first distance along the circumference of the substrate edge between the first reference point and the first position, and for identifying as a second coordinate a second distance along the bevel of the substrate edge between the second reference point and the first position, and
    a memory adapted to capture the first coordinate and the second coordinate as the reference for the first position.

8. The apparatus of claim 7, further comprising an output for sending the reference to a storage means.

9. The apparatus of claim 7, wherein the apparatus comprises one of an optical inspection system, a scanning electron microscope, and a focused ion beam.

10. The apparatus of claim 7, wherein the first reference point is one of a notch, a major flat, a minor flat, and a top of the substrate, and the second reference point is one of a top flat of the bevel, a ninety degree point of the bevel, and a bottom flat of the bevel.

11. The apparatus of claim 7, wherein the element is a sensor.

12. The apparatus of claim 7, wherein the first distance is measured in one of length along the circumference of the substrate and rotation of the substrate.

13. The apparatus of claim 7, wherein the second distance is measured in one of length along the bevel and angular position along the bevel.

14. The apparatus of claim 7, further comprising an input adapted to receive a data structure that correlates the first coordinate, the second coordinate and information about a condition of the substrate at the first position for a plurality of first positions.

15. An apparatus for positioning a substrate to a reference for a first position on an edge of the substrate, the apparatus comprising:
    a stage adapted to receive the substrate and bring the substrate into a known orientation having a first reference point relative to a circumference of the substrate edge, and a second reference point relative to a bevel of the substrate edge,
    an input adapted to receive the reference as a first coordinate of a first distance along the circumference of the substrate edge between the first reference point and the first position, and as a second coordinate of a second distance along the bevel of the substrate edge between the second reference point and the first position, and
    the stage further adapted to move the first position under an element.

16. The apparatus of claim 15, wherein the apparatus comprises one of an optical inspection system, a scanning electron microscope, and a focused ion beam.

17. The apparatus of claim 15, wherein the first reference point is one of a notch, a major flat, a minor flat, and a top of the substrate, and the second reference point is one of a top flat of the bevel, a ninety degree point of the bevel, and a bottom flat of the bevel.

18. The apparatus of claim 15, wherein the element is a sensor.

19. The apparatus of claim 15, wherein the first distance is measured in one of length along the circumference of the substrate and rotation of the substrate, and the second distance is measured in one of length along the bevel and angular position along the bevel.

20. The apparatus of claim 15, wherein the input further reads a data structure that correlates the first coordinate, the second coordinate and information about a condition of the substrate at the first position for a plurality of first positions.

* * * * *